United States Patent
Singer et al.

(10) Patent No.: US 7,605,386 B2
(45) Date of Patent: Oct. 20, 2009

(54) OPTICAL DEVICE WITH RASTER ELEMENTS, AND ILLUMINATION SYSTEM WITH THE OPTICAL DEVICE

(75) Inventors: Wolfgang Singer, Aalen (DE); Johannes Wangler, Koenigsbronn (DE); Markus Deguenther, Aalen (DE); Birgit Kuerz, Aalen (DE); Christoph Menke, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 332 days.

(21) Appl. No.: 11/598,180

(22) Filed: Nov. 10, 2006

(65) Prior Publication Data
US 2007/0146853 A1    Jun. 28, 2007

Related U.S. Application Data

(60) Provisional application No. 60/735,659, filed on Nov. 10, 2005.

(51) Int. Cl.
G03B 27/54 (2006.01)
G03B 27/42 (2006.01)
G21K 5/04 (2006.01)

(52) U.S. Cl. .................. 250/504 R; 250/365; 250/372; 355/37; 359/216; 359/633

(58) Field of Classification Search ........................ None
See application file for complete search history.

(56) References Cited

U.S. PATENT DOCUMENTS

| | | | |
|---|---|---|---|
| 4,474,463 A | 10/1984 | Heimer | 355/71 |
| 5,461,456 A | 10/1995 | Michaloski | 355/67 |
| 5,581,605 A | 12/1996 | Murakami et al. | 378/84 |
| 5,594,526 A | 1/1997 | Mori et al. | 355/67 |
| 5,731,577 A | 3/1998 | Tanitsu | 250/201.5 |
| 6,198,793 B1 | 3/2001 | Schultz et al. | 378/34 |
| 6,333,777 B1 | 12/2001 | Sato | 355/53 |
| 6,438,199 B1 | 8/2002 | Schultz et al. | 378/34 |
| 6,570,168 B1 | 5/2003 | Schultz et al. | 250/492.2 |
| 6,611,574 B2 | 8/2003 | Singer et al. | 378/34 |
| 6,859,328 B2 * | 2/2005 | Schultz et al. | 359/633 |
| 6,947,124 B2 * | 9/2005 | Antoni et al. | 355/67 |
| 7,109,497 B2 * | 9/2006 | Antoni et al. | 250/492.2 |
| 7,142,285 B2 * | 11/2006 | Antoni et al. | 355/67 |
| 7,348,565 B2 * | 3/2008 | Mann et al. | 250/365 |
| 7,405,809 B2 * | 7/2008 | Hainz et al. | 355/67 |
| 7,456,408 B2 * | 11/2008 | Mann et al. | 250/365 |
| 2002/0136351 A1 | 9/2002 | Singer | 378/34 |

(Continued)

FOREIGN PATENT DOCUMENTS

EP        0849637        11/1997

(Continued)

Primary Examiner—David A. Vanore
(74) Attorney, Agent, or Firm—Ohlandt, Greeley, Ruggiero & Perle, L.L.P.

(57) ABSTRACT

The invention relates to an optical device that includes (a) a first optical element with at least one first raster element, where the first raster element has a first axis, (b) a second optical element with at least one second raster element, where the second raster element has a second axis. The first raster element can be changed in its position relative to the second raster element, so that a distance between the first axis and the second axis is variable.

19 Claims, 10 Drawing Sheets

U.S. PATENT DOCUMENTS

| | | | |
|---|---|---|---|
| 2002/0167333 A1 | 11/2002 | Usui | 326/86 |
| 2003/0002022 A1 | 1/2003 | Schultz | 355/67 |
| 2003/0043356 A1 | 3/2003 | Shiraishi | 355/53 |
| 2007/0120072 A1* | 5/2007 | Mann et al. | 250/492.1 |
| 2007/0146853 A1* | 6/2007 | Singer et al. | 359/216 |
| 2008/0278704 A1* | 11/2008 | Endres et al. | 355/67 |

FOREIGN PATENT DOCUMENTS

| | | |
|---|---|---|
| WO | WO0109681 | 2/2001 |
| WO | WO02065482 | 8/2002 |
| WO | WO2005015314 | 2/2005 |

\* cited by examiner

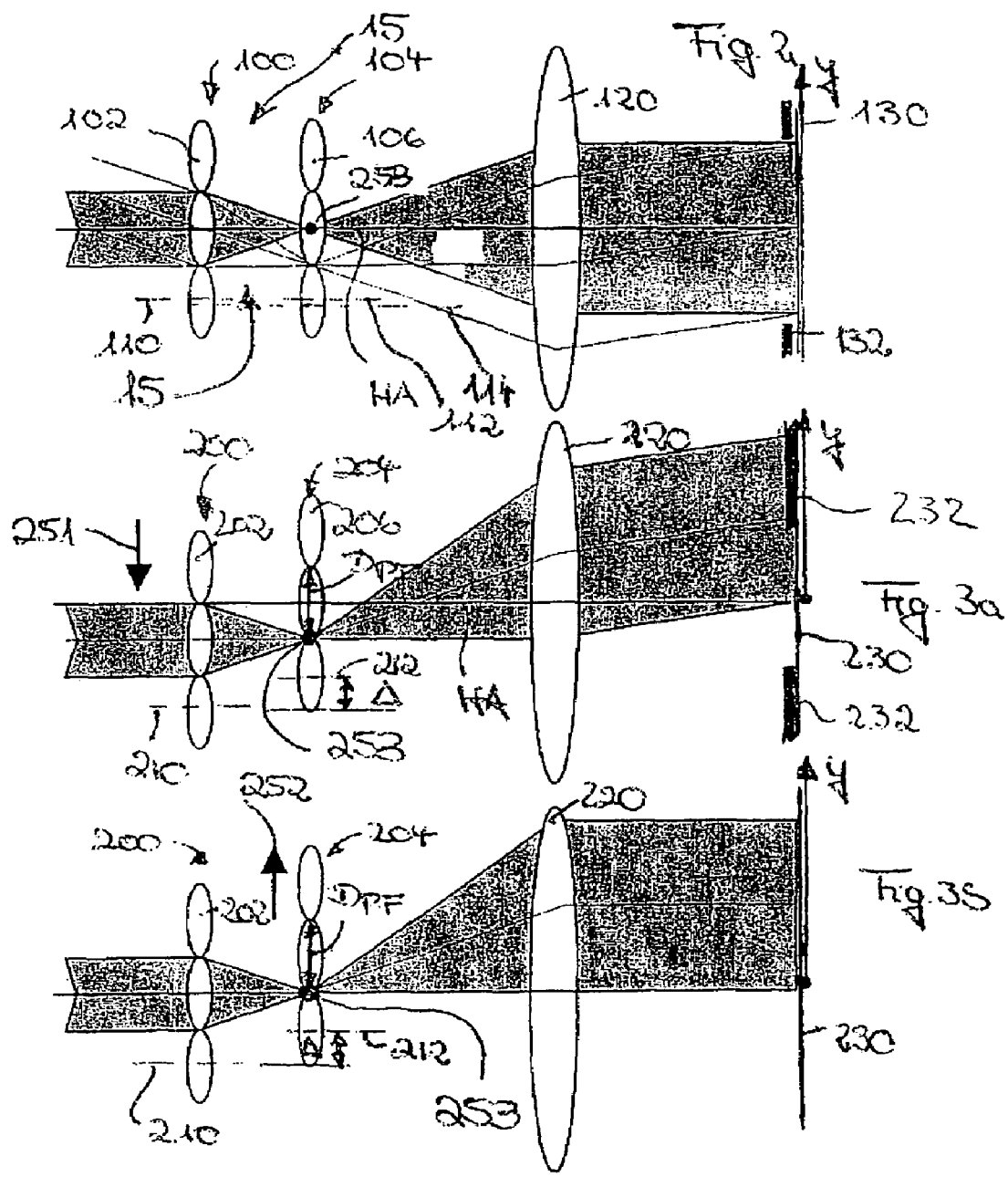

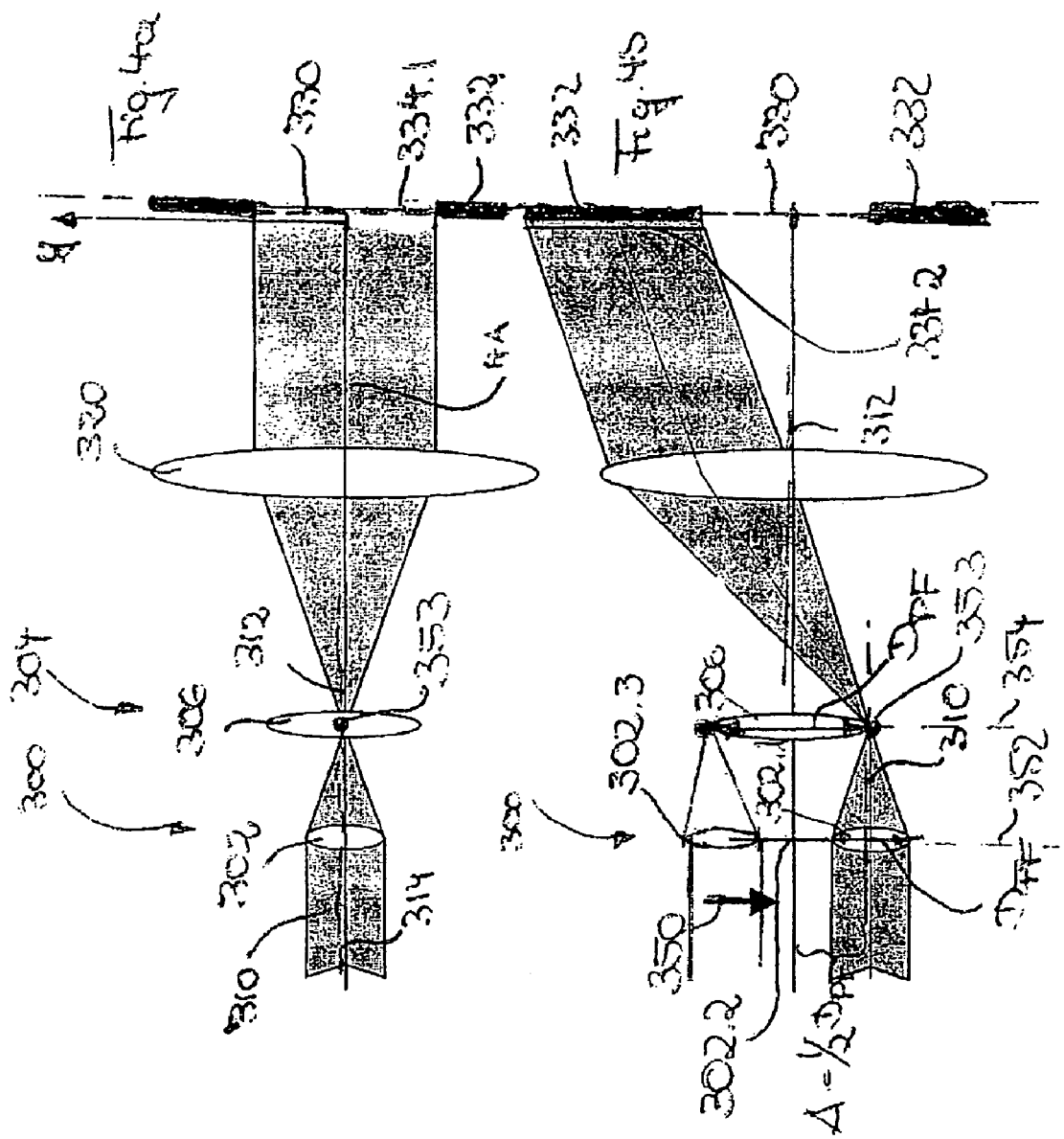

Fig. 5c
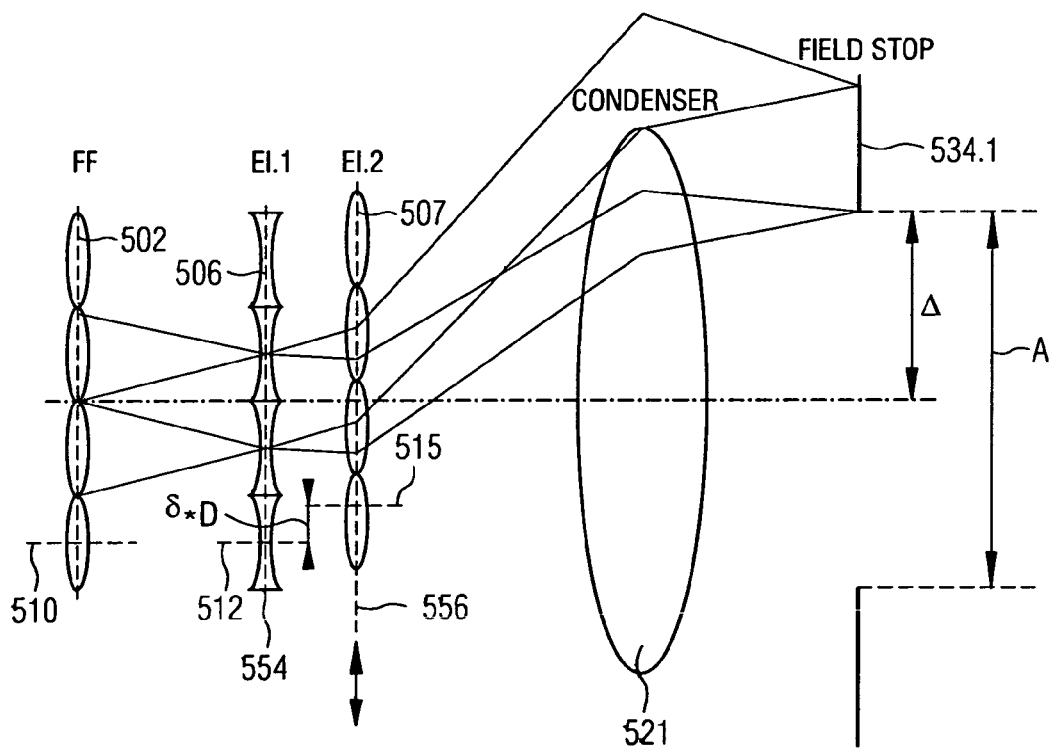
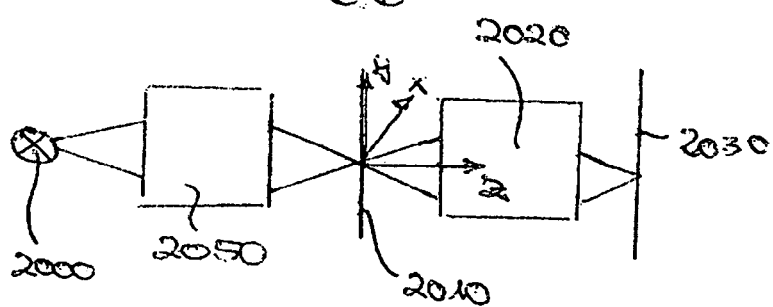
FIG. 6

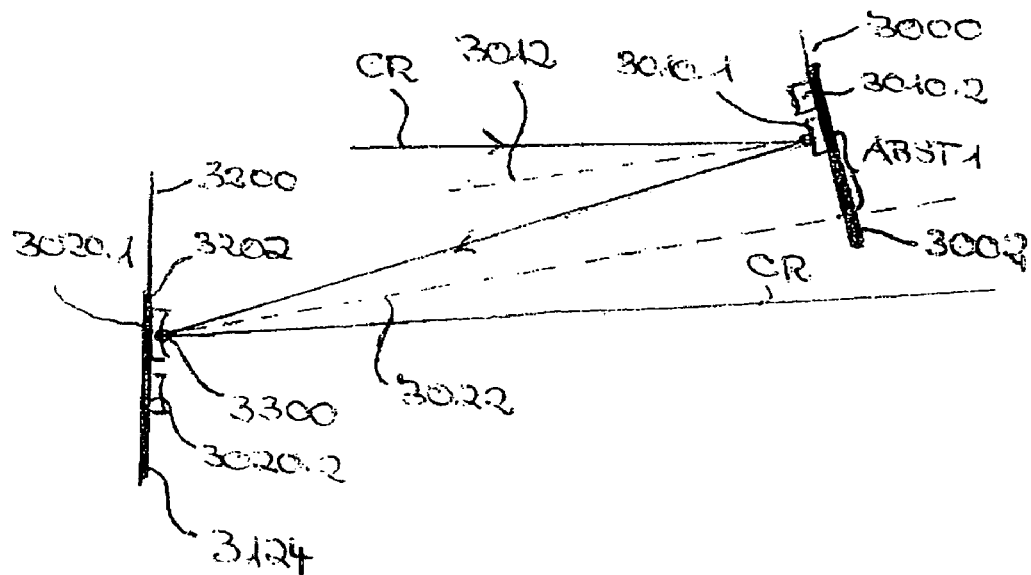
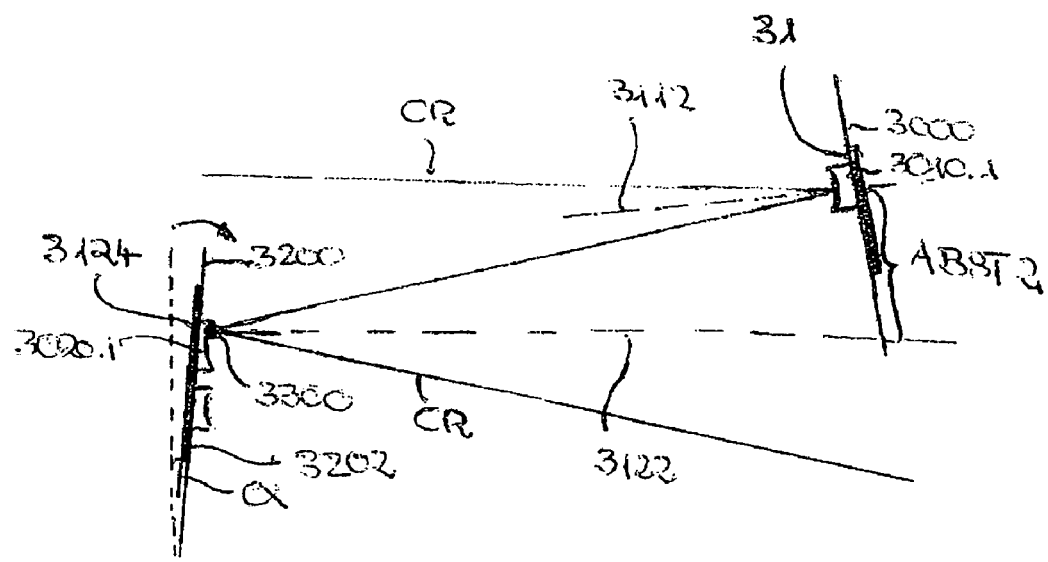

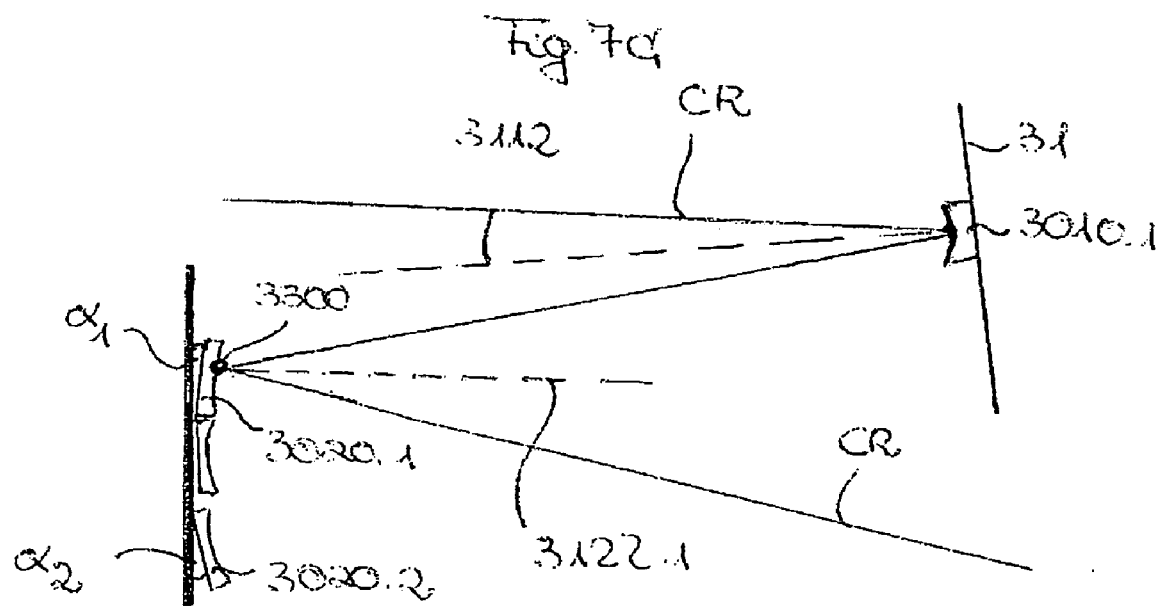

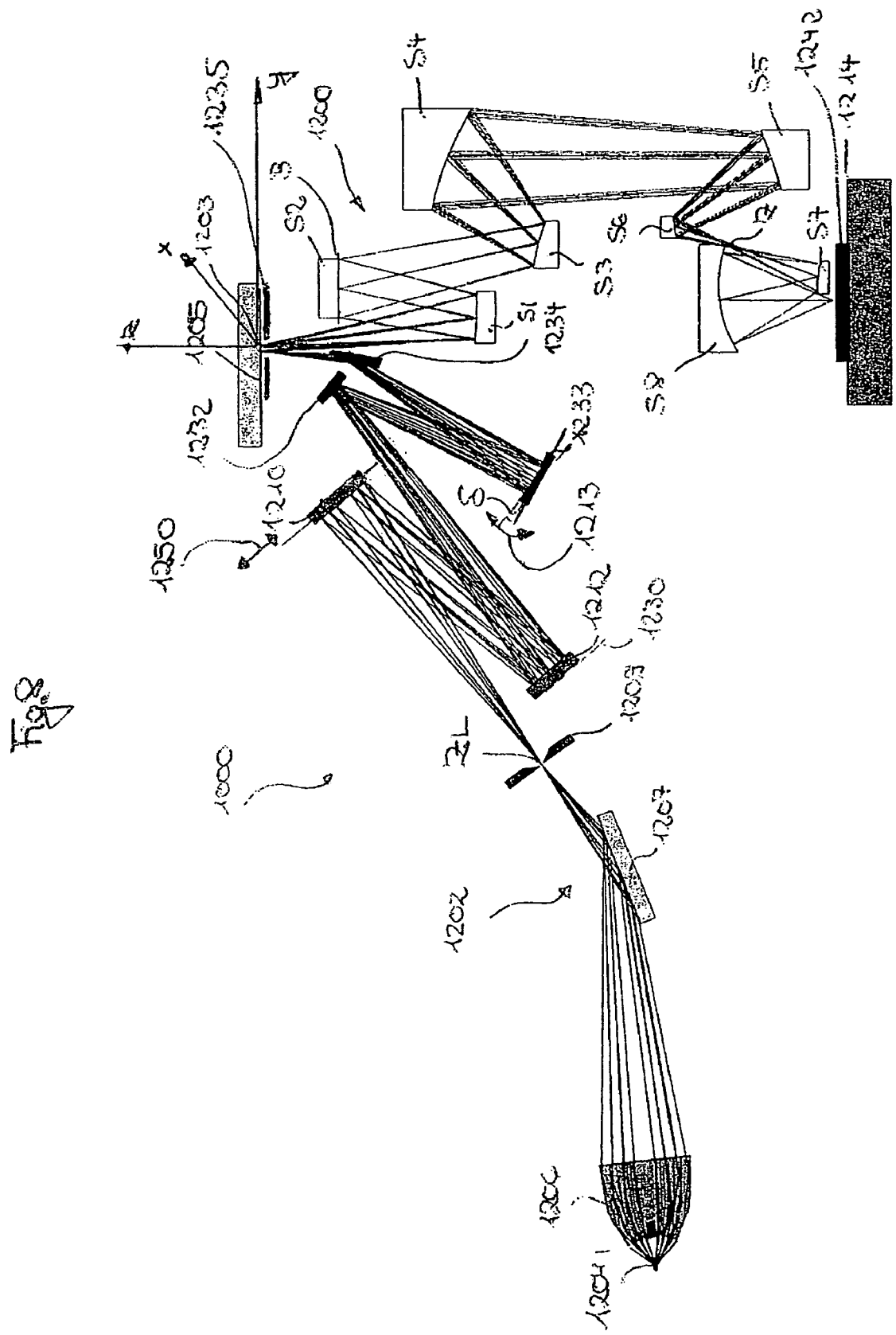

OPTICAL DEVICE WITH RASTER ELEMENTS, AND ILLUMINATION SYSTEM WITH THE OPTICAL DEVICE

CROSS-REFERENCE TO RELATED APPLICATIONS

The present application claims the benefit and priority of the U.S. Provisional Application 60/735,659, filed on Nov. 10, 2005. The content of U.S. Provisional Application 60/735,659 is incorporated in its entirety in the present application.

FIELD OF THE INVENTION

The invention relates to an optical device which is used in particular in an illumination system for microlithographic projection exposure apparatus.

According to a first embodiment, the device includes a first raster element which receives light of a light source, wherein by the first raster element an image of the light source is formed on a second raster element.

According to a second aspect of the invention, the optical device, in particular for an illumination system for use in particular in a microlithographic projection exposure apparatus, includes at least one first optical element with at least one first raster element wherein the first raster element has a first optical axis, and further includes at least one second optical element with at least one second raster element wherein the second raster element has a second optical axis. Arrangements of this kind with first and second raster elements, particularly if they are used in an illumination system, are also referred to as honeycomb condensers. In a microlithography projection exposure apparatus where an illumination area is to be illuminated with the light of a primary light source, honeycomb condensers of this kind serve to convert an input light distribution into an output light distribution. Optical channels are formed between the individual raster elements.

STATE OF THE PRIOR ART

In illumination systems of the kind that are used for example in microlithography projection exposure apparatus, the light of a primary light source is transmitted to an illumination area of a different shape in comparison to the light source. The problem presents itself to illuminate this illumination area as homogeneously as possible with the light from the light source. To accomplish this purpose, homogenization devices are frequently used in illumination systems. Two devices that achieve this kind of a homogenization effect are used with particular preference in illumination systems: Integrator rod or hollow waveguide arrangements, and honeycomb condensers.

An integrator rod arrangement consists substantially of an elongated rod, often of rectangular cross-section, on whose lateral surfaces the light which enters at the end facing the light source is subjected to multiple total reflections, so that at the other end of the rod which faces the illumination area the light comes out mixed and thus largely homogenized. The number of the total reflections at the lateral surfaces of the rod depends substantially on the angle at which the light at the point of its entry into the rod is directed relative to these lateral surfaces.

A honeycomb condenser includes two optical elements, with first and second raster elements between which normally a multitude of optical channels are formed. The way in which the homogenizing effect is achieved in the honeycomb condenser is that a multitude of images of the light source, so-called secondary light sources, are formed by the optical channels, and their respective contributions are then superimposed on each other. This superposition compensates to a certain degree for the variations of the illumination density of the light source from point to point and over time.

In operating a microlithography projection exposure apparatus, an object called reticle is set up in the illumination area of the illumination system, and a projection objective which follows the illumination system in the light path projects an image of the reticle onto a wafer that is set up in an image plane of the projection objective.

Illumination systems with an optical integrator in the light path from the light source to the illumination area are disclosed for example in U.S. Pat. Nos. 5,731,577, 5,461,456, 5,581,605, 6,333,777 or EP-A-0849637. All of the optical integrators described in these references have faceted, i.e. rastered, elements.

In U.S. Pat. No. 5,581,605 an illumination system is disclosed in which a primary light source is split up by means of a honeycomb condenser into a multitude of secondary light sources. As a result of this an even, i.e. uniform illumination is achieved in the reticle plane.

Reflective honeycomb condensers have been disclosed in U.S. Pat. Nos. 6,438,199,6,570,168, 6,611,574, 6,658,084 as well as U.S. Pat. No. 6,704,095 in particular for lithography applications in the EUV range of wavelengths, i.e. wavelengths from 11 to 15 nanometers.

A further system with a reflective honeycomb condenser is shown in WO 01/09681. As means for influencing the field in the field plane, specifically to change its position, so-called reticle-mask apertures were set up in an intermediate field plane. An image of the intermediate field plane was then projected by means of optical elements onto the field plane. An optical imaging arrangement of this kind for reflective systems is disclosed in WO 01/09681.

Systems of this kind for projecting an image of an intermediate image plane which are based on refractive designs have been disclosed for example in U.S. Pat. No. 4,474,463 and U.S. 2003/0043356.

DESCRIPTION OF THE INVENTION

To delimit the field that is to be illuminated, a variable field aperture stop is always used in state-of-the-art systems.

These illumination systems suffered from the drawback that to form the projected image of the intermediate field plane in which the variable field aperture stop was arranged, the variable field aperture stop was projected into the reticle plane by means of mirrors or a lens system.

This had the consequence that in reflective systems of the kind that are used for example in EUV lithography, additional mirrors were required which strongly reduced the light yield of the illumination system. In refractive systems, likewise, a complex high-aperture optical imaging system with a large field has to be used which, for example, includes more than seven individual lenses with aspherical surfaces.

The invention thus has the objective to propose an optical device, in particular for an illumination system in a microlithographic projection exposure apparatus in which an illuminated area in a field plane of the illumination system can be influenced. Thus, for example, the optical device should allow the illuminated surface to be changed in its position, without the need for a complex and expensive system for the projection of an intermediate field plane in which for example field aperture stops are arranged. The aim is in particular to propose an optical device for an illumination system in which an optical imaging system for producing an image of an intermediate field plane is not necessary, but in which it is possible to influence the illuminated area in the field plane. In particular, by placing the optical device into the light path of an illumination system between a light source and a field plane, the intention is to provide a reflective illumination system in which the field can be influenced, but the light losses are kept as small as possible, for wavelengths $\leq 100$ nm, in particular wavelengths in the EUV range, for example between 5 nm and 30 nm, with preference for 11 nm to 15 nm.

Under a first aspect of the invention, the object just outlined is achieved in an optical device which includes at least a first raster element and a second raster element through a design where the second raster element has a width ($D_{PF}$) and the width ($D_{PF}$) of the second raster element is larger than the size of the image of the light source which is projected by the first raster element onto the second raster element. The concept further includes devices whereby the position of the first raster element in relation to the second raster element can be changed.

Under a further aspect of the invention, the optical device, in particular for an illumination system has at least one first raster element with a first axis and at least one second raster element with a second axis, wherein the first axis and the second axis have a distance from each other. The distance in the present context means the distance between the respective points of intersection of the first axis and the second axis in the meridional plane with the plane in which the first optical element, i.e. the first raster element, is arranged. The first optical element with a multitude of first raster elements is also referred to as first faceted optical element. Likewise, the second optical element with a multitude of second raster elements is also referred to as second faceted optical element. According to the invention it is intended that the position of the first raster element can be varied relative to the second raster element, so that the distance of the first axis from the second axis is variable. In a special embodiment of the invention, in particular in refractive systems, the first axis and the second axis can coincide in one common axis. In a special system of this kind, the distance of the first axis from the second axis in an aligned system would be substantially zero. If in an embodiment of this kind, the first raster element is moved relative to the second raster element, the first axis will no longer coincide with the second axis in one common axis. In other words, there will be an offset between the first axis and the second axis. Under the inventive concept, the first axis is moved off-center relative to the second axis.

In a first, refractive embodiment of the invention, by moving the first optical element with the first raster elements in relation to the second optical element with the second raster elements, a lateral offset of the illuminated field is achieved. A field in a field plane, for example together with a fixed aperture stop, can now be variably illuminated. With an arrangement of this kind, a variable illumination of a field in the field plane is achieved without the need to use variable field aperture stops. In particular, no separate optical imaging system for the variable field aperture stops is needed. In this arrangement, the first raster elements are assigned to the first optical element and the second raster elements are assigned to the second optical element.

In an alternative embodiment, a comparable effect can be achieved for a reflective configuration of an optical device with a first optical element with first reflective raster elements and a second optical element with second reflective raster elements, if instead of mutually off-centering a first optical element relative to a second optical element, the second optical element is tilted relative to the first optical element, or if individual second raster elements of the second optical element are tilted. The reflective raster elements are configured as mirrors. By tilting the second raster elements by different tilt angles in a reflective system in which there is generally no longer a common optical axis of the different optical components of the illumination system, the first reflective raster elements can be projected onto different locations in a field plane. This makes it possible to influence the illumination in the field plane and thus to influence the uniformity of the illumination.

The first optical element in its reflective embodiment is also referred to as field honeycomb plate, and the first raster elements are referred to as field honeycombs. The second optical element is referred to as pupil honeycomb plate, and the second raster elements are referred to as pupil honeycombs. The light bundle traveling between a first raster element and an associated second raster element is referred to as light channel. This applies also to embodiments in which the first or the second raster element is designed as a reflective raster element.

The first raster elements or field honeycombs receive the light of for example one or several light sources and split it into individual light bundles assigned to respective first raster elements. The first raster elements are configured so that a multitude of light source images are formed at or near the location at which the second optical element is arranged, where one light source image is assigned to each second raster element. With a multitude of field- and pupil honeycombs, a multitude of light channels are formed. In order to prevent crosstalk between the channels, the width or size of the light source image on the second raster element is preferably smaller than the size or width of the respective second raster element. The term "crosstalk" is used for example with the meaning that as a result of the change in position of the first raster element and the second raster element in relation to each other, the correlation between first and second raster elements is changed.

If for example in a refractive embodiment of the invention, the first raster elements in relation to the second raster elements, or vice versa, are moved in a plane to which the first axis and second axis run perpendicular, the illuminated area can be changed in its position by this kind of a movement. If a field aperture stop which is configured as a fixed aperture stop is arranged in or close to a field plane or a conjugate plane to a field plane, the illuminated area on a reticle arranged in the field plane can be varied as described above by means of an optical device according to the invention in conjunction with the fixed aperture stop. In a special embodiment of the invention, it is even possible to cause the illuminated area in the field plane to totally disappear.

If the first raster element and the second raster element are reflective elements, i.e. configured as mirrors, the illuminated area can be changed by tilting the second optical element relative to a plane that is defined by the first optical element, or by tilting or off-centering individual second raster elements on the second optical element.

In order to prevent crosstalk also with a change in position, one needs not only to select the size of the light source image smaller than the width of the second raster elements, but to also limit the position change of a primary second raster element relative to a first raster element in such a way that the position change will not cause a secondary second raster element to be illuminated, for example one that lies adjacent to said primary second raster element. As explained above, as there are a multitude of first and second raster elements, i.e. field facets and pupil facets, there are a multitude of light channels, wherein to each specific field facet one specific pupil facet is assigned. In the case of crosstalk, light of one channel gets for example into a neighboring channel. If field facets and pupil facets have for example the same aspect ratio, cross talk will already occur in the refractive embodiment if field facets and pupil facets are offset or moved relative to each other by such an amount that the field is moved only by half of a field width.

In an advantageous embodiment, the dimensions of the pupil facets in a direction that coincides with the scan direction in an illumination system are larger than the respective dimensions of the field facets. Accordingly, the aspect ratio of the field facets is different for field- and pupil facets.

If the aspect ratio differs in the way described above, a crosstalk can be safely avoided. A crosstalk can in particular be safely avoided if the pupil facets have a larger width than the size of the images of the light source that are formed at the location of the pupil facets. For many applications, it is sufficient if the pupil facets are at least made larger in one dimension.

In an alternative embodiment of the invention, crosstalk can be prevented from occurring, if for example the aspect ratio is the same in field- and pupil facets, through a design where the pupil facets are divided into at least two optical elements arranged one behind the other. The refractive powers of the consecutively arranged optical elements are selected so that they partially compensate each other if the optical axes coincide in one common axis, but that they exhibit a strong prismatic effect when they are laterally offset from each other. This makes it possible in refractive optical devices with field- and pupil facets that have equal aspect ratios or in cylindrical honeycomb plates to shift the illuminated area completely outside of the field range to be imaged, without thereby causing crosstalk to occur.

If in a special embodiment of the invention the pupil facets are divided as described above, the system will have a first optical element with first raster elements, so-called field facets, a second optical element with second raster elements, so-called first pupil facets, and a third optical element with second pupil facets. With the third optical element with second pupil facets, it is possible to achieve that the illuminated area lies completely outside of a fixed aperture stop. The offset which is required for this in one of the two optical elements which are arranged between the field facets and the mirror- or lens device is smaller than a diameter of the first pupil facet or the second pupil facet.

In the following, the focal length $f_1$ of the first pupil facet as well as the focal length $f_2$ for the second pupil facet are to be determined for the case where in a refractive system the illumination in the field plane is made to disappear by moving the second optical element with first pupil facets or by moving the third optical element with second pupil facets in combination a fixed aperture stop. With the boundary condition that, by design, the illumination be made to completely disappear through a movement of the second optical element with first pupil facets relative to the third optical element with second pupil facets, one obtains the following relationships for the focal lengths $f_1$ and $f_2$ of the first and second pupil facets, respectively:

$$f_1 = \delta * f_{FF}$$

$$f_2 = d_1 + \frac{\delta}{\delta - 1} * f_{FF}$$

in the case where the second optical element with first pupil facets is moved, and $$f_1 = \frac{\delta}{\delta - 1} f_{FF}$$

$$f_2 = d_1 + \delta * f_{FF}$$

in the case where the third optical element with second pupil facets is moved, wherein $f_{FF}$: represents the focal length of the field facet,
$f_1$: represents the focal length of the first pupil facet,
$f_2$: represents the focal length of the second pupil facet,
$d_1$: represents the distance along the main axis HA from the second optical element to the third optical element,
$\delta$: represents a parameter that describes the offset, i.e. the displacement of the second optical element with first pupil facets in relation to the third optical element with second pupil facets, wherein D is the diameter of a pupil facet, and wherein the illuminated field in the field plane is made to disappear by a displacement of $\delta \times D$. If the illuminated field is made to disappear for example by a displacement equal to one-half of the width of the first pupil facet, then $\delta = \frac{1}{2}$.

In order to ensure the separation of the channels and to prevent a crosstalk into the neighboring channel, the divergence angle $\gamma$ before the optical element with field facets is limited to $$\sin \gamma < \frac{(1 - 2\delta)D}{f_{FF}},$$

with D representing the given facet diameter.

In a further developed embodiment, the afore-described optical element is used in an illumination system, in particular an illumination system for a microlithography projection exposure apparatus, for the illumination of an illumination area with light from a primary light source. The optical device in this arrangement includes a first optical element with at least one first raster element with a first optical axis and a second optical element with at least one second raster element with a second optical axis which is arranged so that it follows the primary light source in the light path from the primary light source to the illumination area.

Preferably, the illumination system includes a mirror- and/or lens device arranged so that it follows the optical device in the light path from the light source to the illumination area, i.e. the field plane, with the mirror- and/or lens device in certain embodiments serving to shape the field and to project an image of the second raster elements or the third raster elements into a pupil plane of the illumination system. A shaping of the field with optical elements which are arranged so that they follow the two faceted optical elements with the at least one first raster element and the at least one second raster element is performed in particular in illumination systems that operate in the EUV range. To shape the field, the preference in EUV systems is to use so-called grazing-incidence mirrors. In grazing-incidence mirrors, the reflection of light takes place at a glancing pass. In contrast to this, the reflection at normal-incidence mirrors takes place at systems of multi-layered coating systems due to interference. Examples for such multi-layered coating systems are, e.g. multi-layered Mo/Si coating systems. Grazing-incidence mirrors, on the other hand, have only a small number of reflective layers, with preference for example a metallic layer of ruthenium where for example radiation with a wavelength of 13.5 nm is reflected.

In reflective systems of the type that are used for example in the EUV range, the individual raster elements, i.e. the field raster element and/or the pupil raster element consist as a rule of facet mirrors which are operated with normal incidence. For EUV light with a wavelength of 13.5 nm, the angles of incidence of the rays of a light bundle which fall on the facet mirror under normal incidence are smaller than 40°, and preferably smaller than 30°, relative to the normal vector of the surface of the facet mirror.

However, all optical elements, including the field raster elements and/or the pupil raster elements, can also be operated as grazing-incidence elements where the light meets the reflecting surface at a glancing pass. At a wavelength of 13.5 nm, the angle of incidence at which the rays of a light bundle arrive at and leave the surface in relation to the surface-normal direction is for example more than 70° for a mirror coated with ruthenium, and preferably lies between 70° and 85°.

In an alternative embodiment of an illumination system without field-forming optical components, the first raster elements are not configured with a rectangular shape, but have the shape of the field to be illuminated, for example an arcuate shape. The design of the field raster element in the shape of the field to be illuminated is possible in reflective as well as refractive systems.

In order to prevent that second raster elements, besides projecting images of first raster elements that are assigned to them through a light channel, also project neighboring first raster elements into areas adjacent to the field to be illuminated—in other words, that a so-called crosstalk takes place—it is advantageous if as described above, the size of the image of the light source that is produced by the respective first raster elements comes out smaller than the pupil facet in the plane in which the second raster elements are arranged, which means that the pupil facet is under-filled. With other than ideal point-shaped light sources, the size of the light source in the plane in which the second raster elements are arranged is determined by the size of the primary light source, modified by the imaging scale ratio under which the primary light source is projected into the plane of the second optical element, and/or the defocused arrangement of the second raster elements relative to the first raster elements. Crosstalk according to the present application exists in particular if by changing the relative position of the raster elements, e.g. by offsetting the field raster elements and/or by offsetting or tilting the pupil raster elements, the initially assigned channel correlation of the field raster elements to the pupil raster elements is changed.

In a particularly preferred embodiment of the invention, the illumination system has a fixed aperture stop as a field aperture stop. The term "field aperture stop" is used herein with the meaning of an aperture stop by which the size and shape of the field in a field plane can be influenced.

In illumination systems for scanning imaging systems, a field aperture stop is arranged preferably away from the field plane in order to create a half-shadowed area at the border of the field and thereby avoid steep jumps in intensity.

Besides the optical device as well as the illumination system, the invention also provides a projection exposure apparatus, in particular for microlithography at wavelengths ≦248 nm, in particular ≦193 nm, which includes an illumination system according to the invention. With the illumination system a field such as a ring field in the field plane is illuminated. Arranged in the field plane is a structured mask, an image of which is projected by means of a projection objective onto a light-sensitive object in an image plane. The projection exposure apparatus serves the purpose to put a structure on surfaces of microelectronic components, so-called semiconductor chips. In this regard, the invention also provides a method for the manufacture of microelectronic components.

The invention provides in particular an illumination system for wavelengths in the EUV range, i.e. for wavelengths between 5 nm and 30 nm, which is distinguished by the fact that placing the optical device with at least two reflective raster elements into the light path between a light source and a field plane, it becomes possible to change the illumination in the field of the illumination system by tilting and/or offsetting the pupil raster elements assigned to a channel, while the illumination in the pupil plane of the illumination system remains largely unchanged.

DETAILED DESCRIPTION OF THE INVENTION

The invention will hereinafter be described by making reference to the attached drawings, wherein FIG. 1 represents a schematic lengthwise view of an illumination system of a refractive design, including an embodiment of a honeycomb condenser according to the invention.

FIG. 2 gives a detail view of an optical device, a so-called honeycomb condenser with a first optical element with first raster elements, a second optical element with second raster elements, and with a lens device arranged in the light path after the honeycomb condenser, in a refractive design.

FIGS. 3a-3b show a honeycomb condenser with field facets and pupil facets of equal width in the scanning direction, in a refractive design.

Figure 4C:
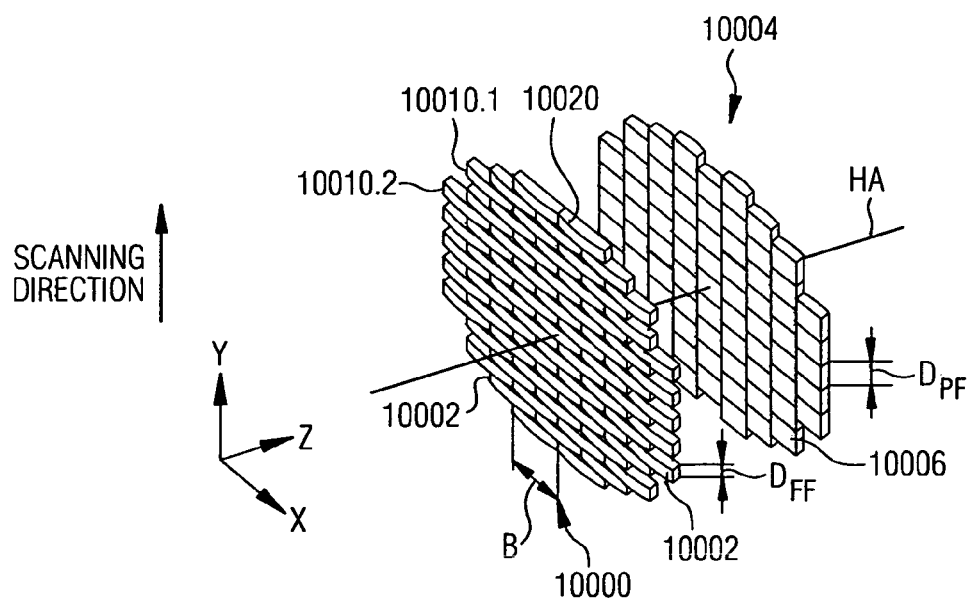
FIGS. 4a-4b show an example for a pair of field- and pupil raster elements of a honeycomb condenser with different widths in the scanning direction, in a refractive design and the effect caused by moving the field raster element.

FIG. 4c gives a three-dimensional view of a multitude of pairs of field and pupil raster elements in a refractive design.

Figure 5A:
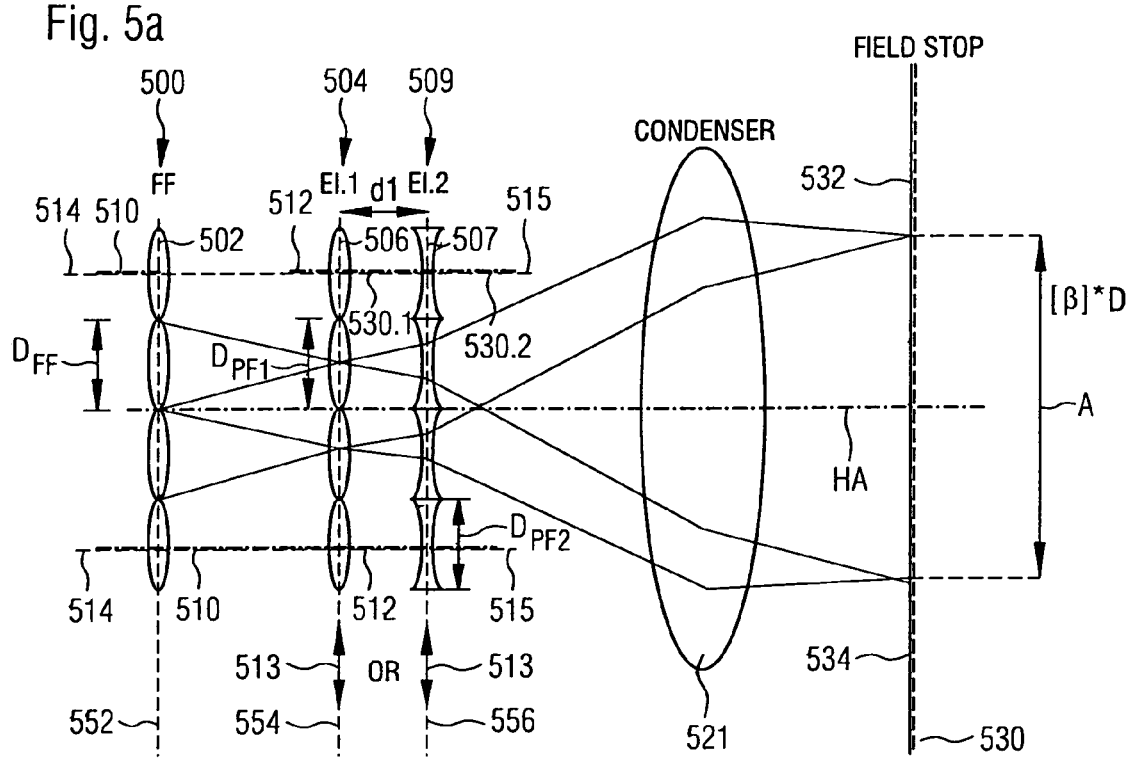
Figure 5B:
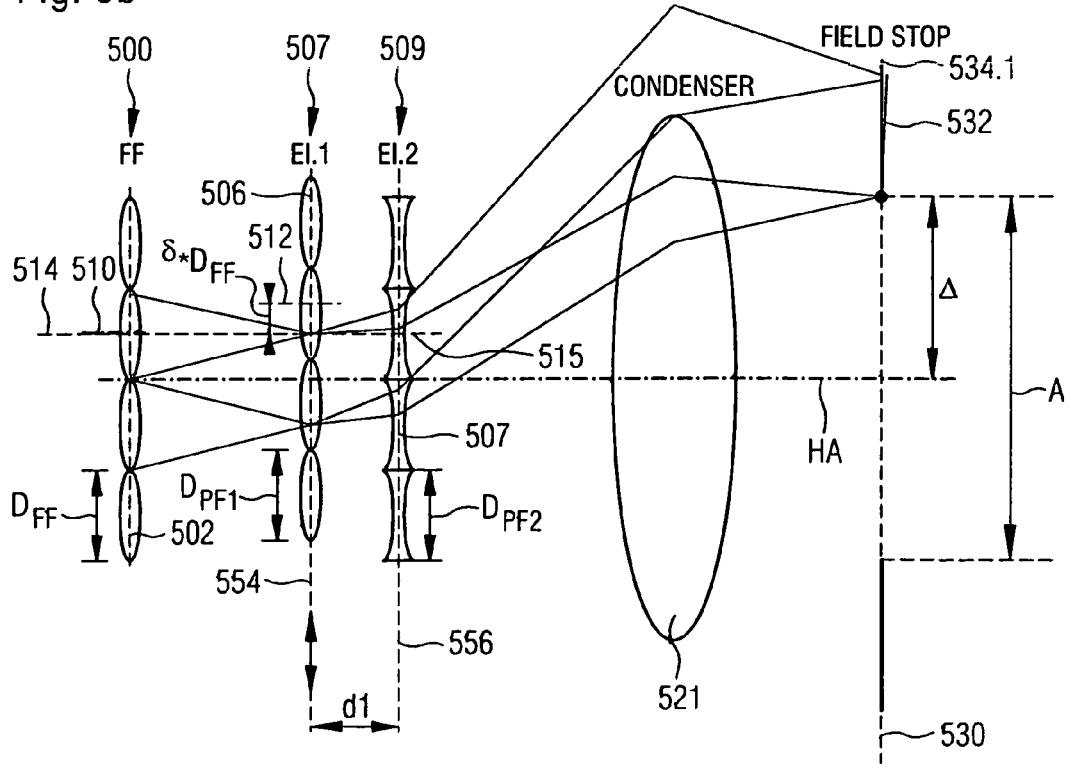

FIGS. 5a-5c represent an arrangement of a system with three optical elements with raster elements, in a refractive design.

FIG. 6 gives a schematic view of a microlithography projection exposure apparatus of a refractive design.

FIGS. 7a-7c illustrate a honeycomb condenser with a first optical element with first reflective raster elements and a second optical element with second reflective raster elements.

FIG. 8 represents an illumination system with reflective components for applications in EUV lithography with a honeycomb condenser with reflective raster elements.

Figure 1:
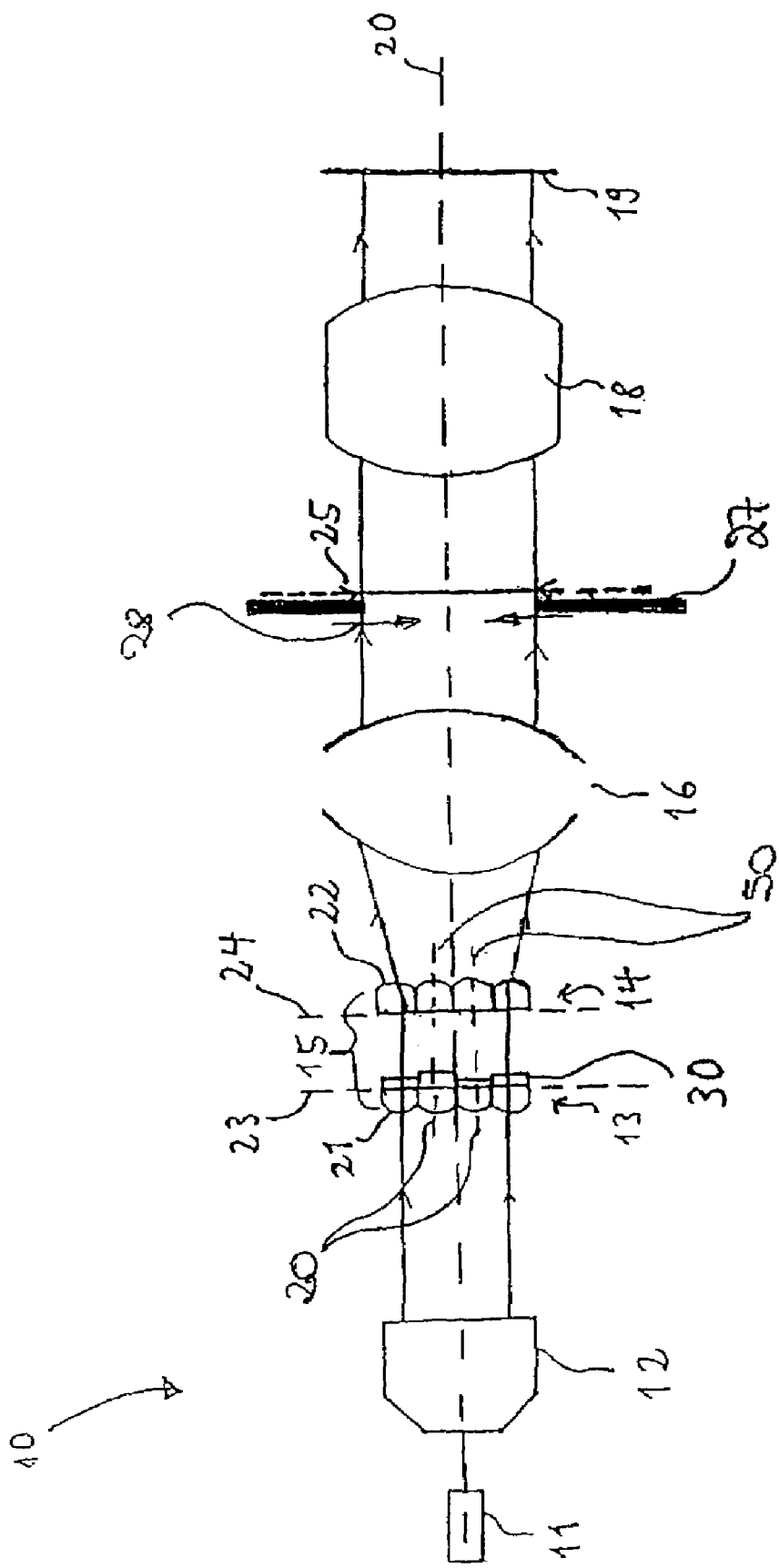
Figure 9A:
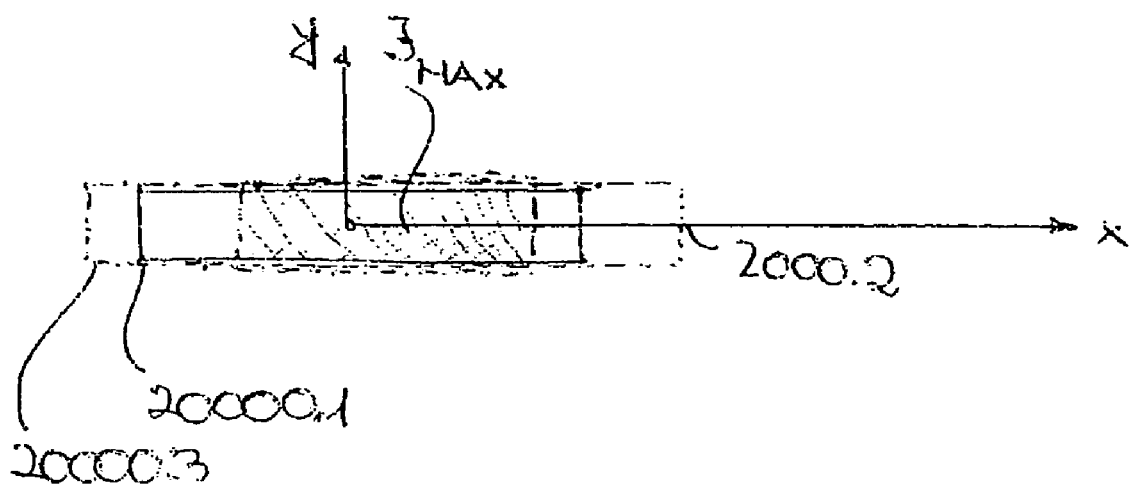
Figure 9B:
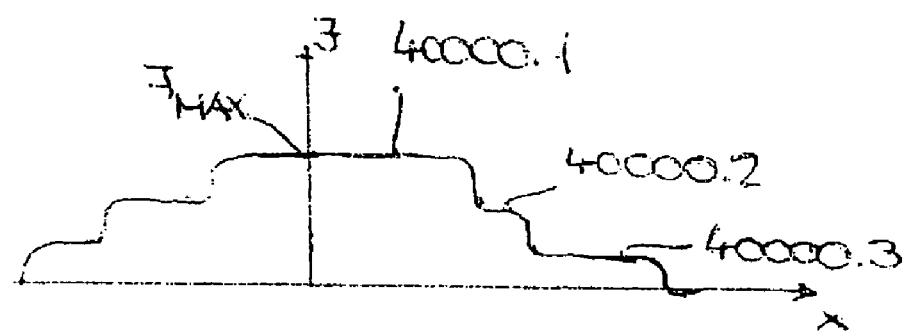

FIGS. 9a-9b illustrate the superposition of three different images of field facets in the field plane with the position of the images in the field plane being different FIG. 1 shows an embodiment of a refractive illumination system 10 of a microlithography projection exposure apparatus which can be used in the manufacture of semiconductor components and other microstructured components and which operates with light in the deep ultraviolet range so as to achieve levels of resolution as fine as a fraction of a micron. The microlithography projection exposure apparatus illustrated in FIG. 1 has a conjugate field plane 25, an image of which is projected by means of an objective 18 into a field plane 19 where a mask can be set up. As a primary light source 11, the refractive illumination system shown here uses for example an $F_2$ excimer laser with an operating wavelength of approximately 157 nm, whose light beam is aligned coaxially with the optical axis 20 of the illumination system. Other UV light sources, for example ArF excimer lasers with an operating wavelength of 193 nm, KrF excimer lasers with an operating wavelength of 248 nm, as well as primary light sources with longer or shorter operating wavelengths are likewise possible. Alternatively, one could also use light sources of other kinds such as for example light-emitting diodes or laser diodes.

The light beam of small rectangular cross-section arriving from the laser first encounters a an optical beam-expanding arrangement 12 which produces an outgoing beam containing largely parallel light of a larger rectangular beam cross-section. The optical beam-expanding arrangement further serves to reduce the degree of coherence of the laser light.

The largely parallel light beam of, e.g., linearly polarized light falls on the entry surface of a first optical element 13 with first raster elements 21 which can be configured for example as cylindrical lenses of identical positive refractive power and rectangular cross-sections, with the first optical element with the first raster elements in this example being constituted by an array of 4×4 cylindrical lenses as first raster elements. The cylinder axes 20 of the cylindrical lenses 21 are also referred to as first axes of the first raster elements. The rectangular shape of the cylindrical lenses 21 corresponds to the rectangular shape of the illumination field 19, meaning that the shape of the first raster elements or field raster elements corresponds to the shape of the field that is to be illuminated. The cylindrical lenses 21 are arranged in a rectangular raster directly adjoining each other, i.e. essentially filling the raster area, in or near a field plane 23 of the illumination system 23. Based on their position in or near a field plane, the cylinder lenses 21 are called field raster elements or field facets. A three-dimensional arrangement of a multitude of field- and pupil raster elements is shown in FIG. 4c.

The cylinder lenses 21 have the effect that the light falling on the plane 23 is split up into a number of light bundles equal to the number of the illuminated cylindrical lenses 21, which are focused onto a pupil plane 24 of the illumination system 10 which lies in the focal plane of the cylindrical lenses 21. In the pupil plane, images of the light source, so-called secondary light sources, are formed generally in the respective foci of the cylindrical lenses. In or near the plane 24 where the secondary light sources are formed, a second optical element with second raster elements is positioned, wherein the second raster elements are for example cylindrical lenses 22 of rectangular cross-section and, e.g., positive refractive power. The cylindrical lenses 22 of the second optical element are also called second raster elements or pupil facets. Each cylindrical lens 21 of the first optical element 13 projects an image of the light source 11 onto a respective corresponding second cylindrical lens 22 of the second element 14, so that a multitude of secondary light sources are produced in the pupil plane 24. A pair of corresponding cylindrical lenses 21, 22 of the first and second optical element 13, 14, respectively, form an optical channel. The first optical element 13 with first raster elements together with the second optical element 14 with second raster elements is also called a honeycomb condenser 15. In the cylinder lenses of the second optical element, the cylinder axes 50 which are perpendicular to the plane of the drawing, are likewise indicated. A cylinder axis 50 is also referred to as second optical axis of the second raster element.

The pupil honeycombs 22 are arranged in the proximity of the respective secondary light sources and, through a field lens 16 which follows in the light path, project the field honeycombs 21 into a conjugate field plane 25 of the illumination system. In the projection, the rectangular images of the field honeycombs 21 are superimposed on each other in the conjugate field plane 25. This superposition has the effect that it makes the light intensity more homogeneous and uniform in the area of the conjugate field plane 25.

In the system shown in FIG. 1, the illuminated field and in particular its size in the field plane, which is also referred to as illumination area 19, is influenced in the same way as in the prior art by a field aperture stop 27 which can be arranged for example in the conjugate field plane 25. The variable field aperture stop can be configured for example as an iris shutter which can delimit the light bundle as shown in FIG. 1 and indicated by the reference symbol 28. An image of the field aperture stop of the conjugate field plane 25 is projected by means of an objective 18 which follows in the light path onto the reticle that is set up in the area of the illumination field. As explained initially, a system of this kind is complicated and expensive to produce and has light losses that are due to the required objective 18. The objective 18 is therefore also denoted as REMA objective or REMA lens.

As described above, the plane 25 is a conjugate field plane or a so-called intermediate plane of the illumination system, in which a so-called reticle-masking system (REMA) is arranged which includes an adjustable field aperture stop. The subsequent objective 18 projects an image of the intermediate plane 25 with the field aperture stop 27 onto the reticle or mask or lithography template which is present in the illumination area 19.

The illumination system 10 shown in FIG. 1, together with a projection objective (not shown), forms a projection exposure apparatus for the microlithographic manufacture of electronic components and also of optical diffractive elements and other microstructured parts. Of course, the illustrated illumination system can also be used for any other kind of illumination with a variable field size, for example in projectors and the like.

FIG. 2 shows a first embodiment of a honeycomb condenser 15 with a first optical element 100 with field facets 102 and a second optical element 104 with pupil facets 106 in a meridional section, i.e. in a plane that includes the main axis HA of the overall system. As may be clearly seen, the honeycomb condenser 15 includes a first optical element 100 with a multitude of first raster elements 102, so-called field facets, which are configured here as refractive optical raster elements or refractive field facets, and a second optical element 104 with a multitude of second raster elements 106 which are likewise configured as refractive optical raster elements or refractive pupil facets.

As described above, the first and second refractive optical raster elements can for example be cylindrical lenses.

Each first raster element 102 has a first axis 110, and each second raster element 106 has a second axis 112. As shown in FIG. 2, the first axis 110 and the second axis 112 are arranged along a common axis 114 which runs parallel to the main axis HA of the overall system.

Through the lens device 120 and the second raster elements, images of the first raster elements are projected into a field plane 130 where an aperture stop 132 can be arranged. The images of the first raster elements largely superimpose themselves on each other in the field plane 130.

Under the invention, it is proposed to influence the magnitude of the illuminated field in the field plane not by projecting an image of a variable field aperture stop arranged in an intermediate plane as shown in FIG. 1, but directly by moving for example the first raster elements relative to the second raster elements (FIG. 3a) or the second raster elements relative to the first raster elements (FIG. 3b) within a plane in which the first or the second optical element is arranged. All components that are identical to the components in FIG. 2 are identified by the reference symbols of FIG. 2 raised by 100. With the aforementioned movement, all first axes 210 of the first raster elements 202 become offset, or off-centered, from the second axes 212 of the second raster elements 206, meaning that they no longer lie on a common optical axis as shown in FIG. 2. The optical axes have an offset A relative to each other. By offsetting the first raster elements 202 relative to the second raster elements 206 and using a fixed aperture stop 232 arranged in the aperture stop plane 230, the illuminated area on the reticle in the reticle plane can be varied. This is illustrated in FIG. 3a.

In the embodiment according to FIG. 3b, the second optical element with the second raster element 204 is offset in the meridional plane relative to the first optical element with raster elements 202, i.e. in a plane that contains the main axis HA of the system. This again has the effect of varying the position of the illuminated surface in the reticle plane of the illumination system.

In the embodiment shown in FIGS. 3a and 3b, the first raster elements, the so-called field facets 202, as well as the second raster elements, the so-called pupil facets 206, have the same aspect ratio, in particular the same width in the scan direction, i.e. in the y-direction. In an arrangement where the field facets and the pupil facets have the same aspect ratio, as soon as the pupil facet is offset relative to the field facet by more than one-half of the facet diameter, the channel that is assigned to a given field facet is projected through the neighboring pupil facet, a condition that is also referred to as crosstalk. In order to prevent crosstalk from occurring, the field facet 202, as shown in FIG. 3a, can be moved relative to the pupil facet 206 only by $\Delta = \frac{1}{2} \cdot D_{PF}$ in the direction 250, or as shown in FIG. 3b, the pupil facet 206 can be moved relative to the field facet 202 only by $\frac{1}{2} \cdot D_{PF}$ in the direction 252. However, the field in the field plane 230 is in this case still half illuminated. The optical axis of the field facet element 202 is identified as 210 and the optical axis of the pupil facet element is identified as 212. In the embodiment shown in FIGS. 3a and 3b a light source image 253 of a primary light source (not shown in the drawing) comes out as practically point-shaped in the second raster element, meaning that the width of the light source image on the second raster element is much smaller than the width of the second raster element. This also applies in particular to the width in a scanning direction of an illumination system, which is referred to herein as y-direction. The light source images 253 are formed by projecting a primary light source (which is not shown in the drawing) for example through the individual first raster elements 102, 202.

If one wishes to achieve that a complete image be projected into the plane in which the reticle is set up, it is preferable to select the width of the pupil facet element—with preference in the direction of movement in which the first or the second optical element is offset in refractive systems—to be larger than the width of the first raster element which is also referred to as field raster element. This is shown in FIGS. 4a and 4b in the form of an example for a pair of refractive field- and pupil raster elements. A complete system with a multitude of field and pupil raster elements of this kind is shown in FIG. 4c.

FIGS. 4a and 4b illustrate in an example how it is possible to achieve a total blackout in the field plane while avoiding crosstalk by offsetting a field facet element relative to a pupil facet element in the case where the pupil facet element as shown here has a significantly larger width at least in the scan direction of the illumination system than the field facet element. An embodiment of a double-faceted illumination system with a honeycomb condenser in which the pupil facet elements have a larger width in scan direction than the field facet elements is shown in U.S. Pat. No. 5,594,526. The scan direction in a microlithography projection exposure apparatus as shown for example in FIG. 6 is also referred to as y-direction. FIG. 4c illustrates a system according to U.S. Pat. No. 5,594,526 in three-dimensional view, where the width of the pupil facets in the scanning direction, i.e in y-direction is larger than the width of the field facets.

FIG. 4a shows the ray pattern for a field facet element 302 of the first optical element and a pupil facet element 306 of the second optical element as well as the lens 320 that follows in the light path, wherein the first axis 310 of the field facet element 302 coincides with the second axis 312 of the pupil facet element 306 and runs parallel to the main axis HA of the optical system. All components are identified by reference symbols analogous to FIG. 1 but raised by 200. The illuminated field in the field plane 330 is identified as 334.1. The fixed aperture stop which is arranged near the field plane 330 is identified as 332. As shown in FIG. 4a, the illuminated field 334.1 is projected in its entirety into the field plane 330 without vignetting. The light source images are identified by the reference symbol 353. The light source images are substantially point-shaped as they were already in the case of FIGS. 3a and 3b.

As shown in FIG. 4b, if the field facet element is moved relative to the pupil facet element by a distance of $\Delta = \frac{1}{2} D_{PF}$ in the direction 350 in the first plane 352, a crosstalk between channels is avoided and the illuminated field is projected by the optical imaging system 320 entirely into an area 334.2 which is blocked off by the field aperture stop 332, so that the illumination in the field plane 330 is made to disappear. If a crosstalk between channels is to be avoided even with a multitude of first and second raster elements arranged above each other in a dense array of the first and second raster elements on a first and a second element, the field raster elements are arranged in rows as shown in FIG. 4c, and two rows lying above each other are arranged with an offset relative to each other. This is also indicated in the sectional drawing in FIG. 4b. A total of three field facets 302.1, 302.2, and 302.3 are shown which lie above each other. As can be seen in FIG. 4b, the field facet 302.2 is offset relative to the field facets 302.1 and 302.3. With preference, the facets are offset relative to each other by exactly one-half of their width as is shown in FIG. 4c which represents a detail of an illumination system from U.S. Pat. No. 5,594,526. The width is defined in this case in the x-direction, i.e. in a direction perpendicular to the scanning direction and perpendicular to the direction in which the main axis HA is oriented.

The field facet element 302 in FIG. 4b has the same reference symbol as in the embodiment shown in FIG. 4a, as does the pupil facet element 306. The width in the scanning direction, i.e., in the y-direction of the pupil facets if $D_{PF}$, the width of the field facet element is $D_{FF}$, and the relationship between the two is in this example $$D_{PF} = 2 \cdot D_{FF}$$

Accordingly, the size of the pupil facets in the present case is about twice the size of the field facets in scanning direction, i.e in y-direction.

The second optical element 304 is arranged in the second plane 354.

The offsetting of the first optical element or the second optical element in relation to each other is performed for example with an electric motor, for example a stepper motor.

FIG. 4c represents in three-dimensional view a refractive optical device consisting of a first optical element 10000 with a multitude of field raster elements 10002, so-called first raster elements, and a second optical element 10004 with a multitude of pupil raster elements 10006, so-called second raster elements. Also indicated are the main axis HA and the y-direction as well as the x-direction. As may be clearly seen, the width $D_{FF}$ of the field facets 10002 in the y-direction, i.e.

in the scanning direction, is smaller than the width $D_{PF}$ of the pupil facets 10004 in the y-direction, analogous to FIGS. 4a and 4b. Also clearly shown is the staggered arrangement of the field facets 10002 in different rows 10010.1, 10010.2. As can be seen in FIG. 4c, the limits or borders 10020 of the individual field facets 10002 in neighboring field-facet rows 10010.1, 10010.2 are offset relative to each other in the x-direction by exactly one/half of the width B of an individual field facet. If the first optical element with field facets 10002 is moved in the scanning direction by one-half of the width $D_{PF}$ a crosstalk into a neighboring channel can be safely prevented.

An alternative embodiment of the invention is illustrated in FIGS. 5a to 5c. In this example, the optical element with pupil facets which in the light path follows the first optical element with field facets is subdivided into two faceted optical elements. The latter two faceted optical elements will hereinafter be referred to as second optical element with first pupil facets and third optical element with second pupil facets.

An embodiment of an arrangement with a second optical element with first pupil facets and a third optical element with second pupil facets is illustrated in FIGS. 5a, 5b, and 5c.

FIG. 5a shows an optical system with a first optical element with field facets 502, a second optical element with first pupil facets 506, and a third optical element with second pupil facets 507. The field facets have a width $D_{FF}$, and the first pupil facets 506 have a width $D_{PF1}$. The aspect ratio of the field facets 502 equals that of the pupil facets 506. The second pupil facets are identified by the reference symbol 507. The second pupil facets 507 have a width $D_{PF2}$ and are of negative refractive power. The distance between the first optical element 504 with first pupil facets 506 and the third optical element 509 with second pupil facets 507 is $d_1$. The second optical element 504 with first pupil facets 506 as well as the third optical element 509 with second pupil facets 507 can be moved along the direction 513. In the embodiment shown in FIG. 5a, the optical axes 510, 512 and 515 that belong to the field facets and first and second pupil facets, respectively, lie on a common optical axis 514 which is parallel to the main axis HA of the system. The optical axis that belongs to the field facet is identified as 510, the axis that belongs to the first pupil facets 506 as 512, and the axis that belongs to the second pupil facets 507 as 515.

In the following, it is assumed for the sake of simplicity that the width $D_{FF}$ of the field facets 502, the width $D_{PF1}$ of the first pupil facets 506, and the width $D_{PF2}$ of the second pupil facets 507 are all equal. With D representing the width of the facets 502, 506, 507, $D=D_{FF}=D_{PF1}=D_{PF2}$. However, the system described here is not limited to this case.

The width A of the illuminated area 534 in the field plane 530 is $\beta \times D$.

The parameter $\beta$ represents the ratio between the width of the illuminated area in the field plane 534 and the width of the field facet 502.

In the following, the aim is to develop a formal calculation for the focal length of the first pupil facets 506 of the second optical element 504 as well as for the second pupil facets 507 of the third optical element 509. The symbols used are $f_1$ for the focal length of the first pupil facets 509, $f_2$ for the focal length of the second pupil facets 507, $f_{FF}$ for the focal length of the field facets 502, and $f_c$ for the focal length of the lens device 521.

If one postulates that the ray positions in the illuminated field be independent of the ray direction ahead of the field facet, one can establish the following condition for the focal length $f_2$ of the second pupil facets 507 (Equation 1):

$$f_2 = d_1 + \frac{f_1 * f_{FF}}{f_1 - f_{FF}}.$$

The imaging ratio $\beta$, i.e. the ratio between the width A of the illuminated field 534 and the width $D_{FF}$ of the field facets 502 conforms to the relationship:

$$\beta = \frac{f_c}{f_{FF}} \left(1 - \frac{d_1}{f_2}\right).$$

FIG. 5b demonstrates how the illumination changes if one moves the second optical element 504 with first pupil facets 506 in the plane 554 relative to the third optical element 509 with second pupil facets 507. The optical design structure is the same as in FIG. 5a; consequently components that are analogous to those in FIG. 5a have the same reference symbols. When the first pupil facets 506 are moved in the plane 554 by an amount $\delta \times D$, one obtains for the offset A of the illuminated field 534 in the field plane 530:

$$\Delta = \frac{f_c}{f_1} \left(1 - \frac{d_1}{f_2}\right) * \delta * D$$

If the offset $\Delta$ of the illuminated field 534.1 in the field plane 530 is as large as the width A of the illuminated field 534, then the illuminated field 534.1 in the field plane 530 will be entirely in the area that is cut off by the field aperture stop 532. Consequently, no light within the field aperture stop 532 falls on the reticle. If the focal length $f_1$ of the first pupil facets 506 and the focal length $f_2$ of the second pupil facets 507 are selected as $$f_1 = \delta * f_{FF}$$

$$f_2 = d_1 + \frac{\delta}{\delta - 1} f_{FF}$$

then the offset $\delta \times D$ of the first pupil raster element 506 in the plane 554 will cause an offset $\Delta = A$ of the illuminated field 534.1 in the field plane 530. At the same time, Equation 1 will be satisfied, i.e. the ray position in the field plane 530 will be independent of the ray direction ahead of the field facet 502.

With the foregoing choice of the focal lengths $f_1$ of the first pupil facets 506 and the focal lengths $f_2$ of the second pupil facets 507, it is possible to achieve a complete blackout of the field plane 530 without crosstalk, even if the widths of the pupil facet elements 506 and 507 are no larger than those of the field facet elements 502. To achieve this result, it is necessary to select $\delta < \frac{1}{2}$.

In real (i.e. not idealized) systems the light source is not projected by the raster elements as a point into the plane in which the second raster elements are arranged, but rather as an image with a certain width. In order to prevent crosstalk, also when the optical elements are not offset relative to each other, the magnitude of the image of the light source in the plane in which the first pupil facets are arranged must be no larger than $(1-2\delta) \cdot D$.

As a necessary condition for this, the angle of divergence y ahead of the first raster element with field facets 502 for a given facet diameter $D_{FF}$ of the field facets needs to be limited to $$\sin \gamma < \frac{(1-2\delta)D_{FF}}{f_{FF}}$$

If this condition is satisfied, the illuminated portion at the location where the first pupil raster element 506 is positioned will be at most $(1-2\delta) \cdot D_{FF}$. Consequently, an offset of the pupil facet element 506 in the plane 554 by an amount $\delta \times D_{FF}$ is possible in the positive as well as in the negative sense without crosstalk occurring. With a sufficiently small distance $d_1$ between the second optical element and the third optical element, crosstalk can also be prevented at the second pupil facet element 507.

In the embodiment shown in FIG. 5c, the optical device includes a second optical element with first pupil facets of negative refractive power and a third optical element of positive refractive power. In the embodiment shown in FIG. 5c, the optical element 509 with the second pupil facets 507 will be offset in the plane 556 relative to the second raster element 504 with the first pupil facets 506. If the second pupil facets 507 are moved in the plane 556 by a distance $\delta \times D$, one obtains for the offset A of the illuminated field 534 in the field plane 530:

$$\Delta = \frac{f_C}{f_2} * \delta * D.$$

In the same manner as above, one can derive equations from this result for the focal lengths $f_1$ of the first pupil facets 506 and the focal lengths $f_2$ of the second pupil facets 507:

$$f_1 = \frac{\delta}{\delta - 1} * f_{FF}$$
$$f_2 = d_1 + \delta * f_{FF}$$

With this choice of the focal lengths $f_1$ of the first pupil facets 506 and the focal lengths $f_2$ of the second pupil facets 507, an offset $\delta \times D$ of the raster element 509 in the plane 556 will cause an offset $\Delta = A$ of the illuminated field 534.2 in the field plane 530. At the same time, Equation 1 will be satisfied, i.e. the ray position in the field plane 530 will be independent of the ray direction ahead of the field facet 502.

With the foregoing choice of the focal lengths $f_1$ of the first pupil facets 506 and the focal lengths $f_2$ of the second pupil facets 507, it is possible to achieve a complete blackout of the field plane 530 without crosstalk, even if the widths of the pupil facet elements 506 and 507 are no larger than those of the field facet elements 502. To achieve this result, it is necessary to select $\delta < \frac{1}{2}$.

Due to the condition that $\delta < \frac{1}{2}$, it is therefore necessary for the first pupil facet 506 to have a negative refractive power in the case where the second pupil facet 507 is offset against the first pupil facet 506 in the embodiment shown in FIG. 5c.

FIG. 6 shows in a schematic representation a projection exposure apparatus of a refractive design.

An illumination system which includes an optical device of the kind shown in FIGS. 2 to 5c illuminates a field in a field plane 2010 by means of one or more light sources 2000. An x-y-z coordinate system is outlined in the field plane 2010. A reticle arranged in the field plane 2010 is moved in the scanning direction which is in this case the y-direction. An image of the reticle in the field plane is projected by means of a projection objective 2020 into a plane 2030 where a light-sensitive object is arranged. The optical device shown in FIG. 2 to 5c is included in the illumination device 2050.

In a most preferred embodiment the illumination device is similar to the illumination device shown in FIG. 1 with the difference, that due to the optical device according to FIG. 1 the field in the field plane can be influenced without a reticle masking system. The reticle masking system as shown in FIG. 1 comprises an adjustable field aperture stop denoted with the reference number 28. Furthermore the illumination device 2050 does not comprise a REMA-objective, denoted in FIG. 1 with reference number 18 to project an intermediate plane into a field plane in which e.g. a reticle is situated.

FIGS. 7a to 8 illustrate an example for a reflective design of the inventive concept of the kind that finds application for example in EUV lithography.

FIG. 7a illustrates the ray pattern from a first optical element 3002 with first raster elements 3010.1 and 3010.2 to a second optical element 3202 with second raster elements 3020.1 and 3020.2. Only the principal ray CR of a light channel from a first raster element 3010.1 to a second raster element 3020.1 is shown. The first and second raster elements in a reflective design are configured as mirrors. They are also called facet mirrors.

The first axis of the first raster element 3010.1 is identified as 3012, the second axis of the second raster element 3020.1 as 3022. The two axes, i.e. first and second axes 3012 and 3022, respectively, are spaced from each other at a distance ABST1, measured in the plane 3000 in which the first optical element 3002 is arranged. The second optical element 3202 is arranged in a second plane 3200.

If for the purpose of adjusting the field illumination the second optical element 3200 is tilted by an angle $\delta$ as shown in FIG. 7b, the tilting changes the position of the second axis 3122 of the second raster element 3020.1 which is arranged on a support device 3124 of the second optical element, and thus it also changes the distance ABST2 from the first axis 3112 of the first raster element 3010.1 in the plane 3000 where the first optical element is arranged. Through the tilting, the illumination in the field plane can be changed or it can be made to entirely disappear. Especially one can see from FIG. 7b that the location of the secondary light source 3300 on the pupil facet 3020.1 changes, which influences the illumination in the field plane.

As an alternative or in addition to the tilting of the second optical element 3202, it is also possible to offset the first optical element 3002 and/or the second optical element 3002 in the plane 3000 in order to change the illumination in the field plane.

Particularly preferred is an arrangement where not the entire second optical element 3202 is tilted and/or offset, but where individual second raster element are tilted by different angles as shown in FIG. 7c. Thus, the second raster element 3020.1 in FIG. 7c is tilted by an angle $\alpha_1$ and the second raster element 3020.2 by and angle $\alpha_2$. In addition or as an alternative, each of the second raster elements can be individually offset. The same optical elements as in FIGS. 7a and 7b are denoted with the same reference numbers in FIG. 7c.

Quite generally in reflective as well as refractive illumination systems, the field in the field plane is influenced according to the invention by moving the position of the light source images, i.e. of the secondary light sources, in the plane in which the second optical element with pupil raster elements is arranged. With preference, the moving of the light source images is effected in such a way that different locations are illuminated on the respective second raster element. Through this movement of the light source images one achieves a movement of the field in the field plane. If the position of the light source image on the second raster element is individually set for each second raster element, it is possible to individually select the position of the field that is taken up in the reticle plane by each individual field facet. By the superposition of the images of the individual field facets in the field plane or reticle plane, it is now possible to set a desired uniformity of the illumination in the field plane. With preference, the offsetting of the light-source images on the second raster element occurs in such a way that a crosstalk between channels is avoided.

FIG. 8 illustrates a reflective design of a projection exposure apparatus, in particular for wavelengths in the EUV range, in which the honeycomb condenser is configured according to the invention as shown in FIGS. 7a and 7b. By tilting the second optical element 1230 by an angle δ as shown and described in the context of FIGS. 7a and 7b, the images of the field facets can be projected partially or completely outside of a field aperture stop. The field aperture stop is arranged either in a conjugate field plane or near the field plane itself in which a mask, for example a reticle, can be set up. Furthermore by tilting each pupil facet individually it is possible to project the images of each field facet in different positions in the field plane as shown in FIGS. 9a to 9b.

The projection exposure apparatus shown in FIG. 8 represents a system of an entirely reflective design of the type that is used for example in lithography applications with wavelengths <100 nm, particularly for EUV lithography. In an entirely reflective system the optical components such as raster elements of the optical elements are configured as mirrors.

The projection exposure apparatus 1000 in the embodiment shown in FIG. 8 includes as a light source a radiation source 1204 which emits light rays.

The light of the radiation source 1204 is directed by means of an illumination system 1202 into the object plane of a projection objective of the projection exposure apparatus and illuminates a reticle in the object plane 1203 of the projection objective which coincides with the field plane of the illumination system.

The illumination system 1202 can be configured in a way that is described for example in WO 2005/015314, entitled "Illumination System, in Particular for EUV Lithography", or U.S. patent application Ser. No. 09/305,017, entitled "Microlithography".

The light of the light source or radiation source 1204 is gathered by a collector 1206. The collector 1206 illustrated in FIG. 8 is a grazing-incidence collector of the type that is disclosed, e.g. in WO 02/065482 A2. Following the collector 1206 in the light path is a spectral grid filter 1207 which together with the aperture stop 1209 in the vicinity of the intermediate image ZL of the light source 1204 serves the purpose of filtering out unwanted radiation of wavelengths other than the usable wavelength of, e.g. 13.5 nm and to keep it from entering into the illumination system that lies behind the aperture stop.

Arranged behind the aperture stop 1209 is a first optical element 1210 with, e.g., 122 first raster elements or field facets (not shown in the drawing). The first optical element can be configured as shown in principle in FIGS. 7a, 7b and 7c, where the first optical element has field facets of a reflective design. The field facets form secondary light sources in a plane 1230. Arranged close to or in the plane 1230 in which the secondary light sources are formed is a second optical element 1212 with second raster elements or pupil facets (not shown in the drawing) which together with the mirrors 1232, 1233 and 1234 which follow in the light path after the second element project an image of the field into the field plane which coincides with the object plane 1203 of the projection objective 1200.

The second optical element can be configured as illustrated in principle in FIGS. 7a, 7b and 7c. In a first embodiment of the invention, in order to change the illumination of the field in the object plane 1203, the second optical element 1212 or individual pupil facets are tilted e.g. by an angle δ in the tilt direction 1213 as described in the context of FIGS. 7a and 7b. Normally, tilting angles of less than one degree are sufficient for this. As an alternative or in addition to this, the second optical element 1212 can also be moved to an offset position.

As an alternative or additional feature, it is also further possible that the first optical element 1210 with field facets (not shown in the drawing) is moved in the plane in which the first optical element 1210 is set up, as indicated by the arrow 1250.

In an especially preferred embodiment of the invention, the positions of the light source images, which are also referred to as secondary light sources, are adjusted or changed on each individual pupil facet mirror. This can be achieved if each individual pupil facet mirror is individually tiltable and/or movable, i.e. changeable in its position. With such an arrangement each image of a field facet can be adjusted individually in the field plane.

Also shown in the drawing are the first axis 1252 and the second axis 1254.

In the illustrated embodiment, a fixed aperture stop 1235 is arranged as a field aperture stop in the vicinity of the object plane 1203. Due to the fixed aperture stop 1235 as described above, by tilting the first optical element 1210 relative to the second optical element 1212, the illumination in the object plane 1203 can be made to completely disappear. Also shown in FIG. 8 is the local x-y-z coordinate system in the field plane. The y-direction in this case represents the scanning direction, if the illustrated microlithography projection exposure apparatus is configured as a ring field scanner.

Arranged in the object plane or field plane 1203 is for example a structured mask 1205, the so-called reticle, of which an optical image is projected by means of the projection objective 1200 into the image plane 1214 of the projection objective 1200. The projection objective in the illustrated embodiment has eight mirrors, i.e. the mirrors S1, S2, S3, S4, S5, S6, S7 and S8. A substrate with a light-sensitive coating 1242 is arranged in the image plane 1214. The substrate with a light-sensitive coating can be given a structure through subsequent exposure- and development processes, for example for the purpose of producing a microelectronic component, e.g. a wafer with a multitude of electrical circuit elements.

In FIG. 9a a field in a field plane is shown. The field in the field plane is a superposition of the three images 20000.1, 20000.2 and 20000.3 of three field facets. As can be seen from FIG. 9a by tilting the pupil facets individually the position of the image 20000.1, 20000.2, 20000.3 of the field facet in the field plane can be varied.

The intensity profile in x-direction of the field shown in FIG. 9a is shown in FIG. 9b. As can clearly be seen by shifting the position of the image of the pupil facets in the field plane, the intensity profile e.g. in x-direction can be influenced.

The invention claimed is:

1. A method of adjusting the illumination in a plane that is illuminated by an illumination system, wherein the illumination system comprises a first raster element and a second raster element, and wherein the position of the first raster element relative to the second raster element is changed in such a way that a predetermined illumination is achieved in said plane.

2. The method of claim 1, wherein the fist raster element is offset in a first plane relative to the second raster element and/or the second raster element is offset in a second plane relative to the first raster element.

3. The method of claim 1, wherein the second raster element is put into a tilted position relative to the first raster element.

4. An optical device for an illumination system for a microlithographic projection exposure apparatus, comprising a first raster element which receives light of a light source, wherein the first raster element produces a light source image of the light source on a second raster element, wherein the light source image is of a magnitude and the second raster element is of a width that is larger than the magnitude of the light source image, and wherein the first raster element can be changed in its position relative to the second raster element.

5. The optical device of claim 4, wherein the first raster element is part of a multitude of first raster elements, wherein said multitude of first raster elements forms a first optical element, in particular a first faceted optical element.

6. The optical device of claim 4, wherein the second raster element is part of a multitude of second raster elements, wherein said multitude of second raster elements forms a second optical element, in particular a second faceted optical element.

7. The optical device of claim 5, wherein the first optical element is arranged in a first plane and the first optical element is configured to be movable in the first plane, so that by moving the first optical element the position of the first raster element is changed in relation to the second raster element.

8. The optical device of claim 6, wherein the second optical element is arranged in a second plane and the second optical element is configured to be movable in the second plane, so that by moving the second optical element the position of the first raster element is changed in relation to the second raster element.

9. The optical device of claim 5, wherein a first multitude of first raster elements are arranged in a first column and a second multitude of first raster element are arranged in a second column, and the first raster elements in the first column have a first multitude of first limits and the raster elements in the second column have a second multitude of second limits, and wherein the first column is moved in relation to the second column in a direction along the column, so that the first limits have an offset in relation to the second limits.

10. The optical device of claim 4, wherein the first raster element is configured in a reflective design as a first raster mirror element.

11. The optical device of claim 10, wherein the second raster element is configured in a reflective design as a second raster mirror element.

12. The optical device of claim 11, wherein the second raster element is arranged to be tiltable relative to a plane.

13. The optical device of claim 4, wherein the first raster element has substantially the shape of a field to be illuminated.

14. An illumination system for use in microlithography, comprising the optical device of claim 4, wherein a field in a field plane is illuminated.

15. The illumination system of claim 14, further comprising a mirror and/or lens device that is arranged so that it follows the optical device in the light path from the light source to the field plane.

16. The illumination system of claim 14, further comprising a field aperture stop.

17. The illumination system of claim 14, wherein the optical device is of a refractive design.

18. The illumination system of claim 14, wherein the optical device is of a reflective design.

19. An illumination system for use in microlithography, comprising a first optical element serving to form a multitude of light source images of a light source on a pupil raster element of a second optical element, wherein devices are provided by which the position of the light source images on said pupil raster element can be changed.

* * * * *